(12) United States Patent
Bruce et al.

(10) Patent No.: US 6,608,494 B1
(45) Date of Patent: *Aug. 19, 2003

(54) SINGLE POINT HIGH RESOLUTION TIME RESOLVED PHOTOEMISSION MICROSCOPY SYSTEM AND METHOD

(75) Inventors: Michael R. Bruce, Austin, TX (US); Rama R. Goruganthu, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/205,589

(22) Filed: Dec. 4, 1998

Related U.S. Application Data

(63) Continuation-in-part of application No. 09/409,088, filed on Sep. 30, 1999, now Pat. No. 6,483,327.

(51) Int. Cl.[7] ........................ G01R 31/302; H01H 31/02

(52) U.S. Cl. ........................................ 324/752; 324/537

(58) Field of Search .............................. 324/752, 537; 359/197, 212, 238, 239; 356/338, 342, 445, 447, 448; 250/338.1, 338.4, 339.02, 370.01, 370.1

(56) References Cited

U.S. PATENT DOCUMENTS

| | | | | |
|---|---|---|---|---|
| 4,843,329 A | * | 6/1989 | Beha et al. | 324/752 |
| 5,270,643 A | * | 12/1993 | Richardson et al. | 324/752 |
| 5,412,328 A | * | 5/1995 | Male et al. | 324/752 |
| 5,451,863 A | * | 9/1995 | Freeman | 324/752 |
| 5,550,479 A | * | 8/1996 | Wakana et al. | 324/752 |
| 5,631,571 A | * | 5/1997 | Spaziani et al. | 324/752 |
| 5,663,652 A | * | 9/1997 | Freeman | 324/752 |
| 5,940,545 A | | 8/1999 | Kash et al. | 382/312 |
| 6,028,952 A | | 2/2000 | Kash et al. | 382/181 |
| 6,177,989 B1 | * | 1/2001 | Bruce | 356/237.5 |
| 6,410,349 B1 | * | 6/2002 | Bruce et al. | 438/14 |
| 6,483,327 B1 | * | 11/2002 | Bruce et al. | 324/752 |

OTHER PUBLICATIONS

Barton, D.L., et al., *Infrared Light Emission From Semiconductor Devices*, 22$^{nd}$ International Symposium for Testing and Failure Analysis, Nov. 18–22, 1996, Los Angeles, CA., pp. 9–17.

Bruce, Michael R., *Study of Reactive Quenching of Xenon by Chlorides Using Two Photon Laser Excitation*, 1990 Dissertation, 1990 University of Texas, pp. 54–64.

Bruce, V.J., *Energy Resolved Emission Microscope*, 1993 IEEE/IRPS, CH3194–8/93/0000–0178.

Charbonneau, S., et al., *Two–dimensional time–resolved imaging with 100–ps resolution using a resistive anode photomultiplier tube*, 1992 American Institute of Physics, 5315—Rev. Sci. Instrum. 63 (11), Nov. 1992.

Cova, S. et al., *20–ps timing resolution with single–photon avalanche diodes*, 1989 American Institute of Physics, 1104—Rev. Sci. Instrum. 60(6), Jun. 1989.

Cova, S., et al., *Avalanche Photodiodes For Near–Infrared Photon–Counting*, SPIE vol. 2388, 1/95, pp. 56–66.

Dautet, H., et al., *Photon Counting Techniques with Silicon Avalanche Photodiodes*, Applied Optics, vol. 32, No. 21, 20 Jul. 1993, pp. 3894–3900.

(List continued on next page.)

Primary Examiner—Kamand Cuneo
Assistant Examiner—Jermele Hollington

(57) ABSTRACT

A method and system providing single point high spatial and timing resolution for photoemission microscopy of an integrated circuit. A microscope having an objective lens forming a focal plane is arranged to view the integrated circuit, and an aperture element having an aperture is optically aligned in the back focal plane of the microscope. The aperture element is positioned for viewing a selected area of the integrated circuit. A photo-diode optically aligned with the aperture to detect photoemissions when test signals are applied to the integrated circuit.

32 Claims, 4 Drawing Sheets

OTHER PUBLICATIONS

Firmani, C., et al., *High–Resolution Imaging with a Two–Dimensional Resistive Anode Photon Counter*, Rev. Sci. Instrum. 53(5), May 1982, pp. 570–574.

Hawkins, Charles F., et al., *The Use of Light Emission in Failure Analysis of CMOS ICs*, 1997 ASM International, pp. 55–66.

Hu, Chenming, *Hot–Carrier Effects*, Department of Electrical Engineering and Computer Sciences, University of California–Berkeley, VLSI Electronics: Microstructure Science, vol. 18, Chap. 3, pp. 119–160.

Hu, Chenming, et al., *Hot–Electron–Induced MOSFET Degradation—Model, Monitor, and Improvement*, IEEE Transctions on Electron Devices, vol., Ed–32, No. 2, Feb. 1985.

Kash, J.A., et al., *Full Chip Optical Imaging of Logic State Evolution in CMOS Circuits*, IEDM '96 Late News Paper, pp. 1–3.

Kash, J.A., et al., *Hot Luminescence from CMOS Circuits: A Picosecond Probe of Internal Timing*, IBM Research Division, Yorktown Heights, NY, Phys. Stat. Sol., vol. 204, pp. 507–516.

Kash, J.A., et al., *Dynamic Internal Testing of CMOS Circuits Using Hot Luminescence*, IEEE Electron Device Letters, vol. 18, No., Jul. 1997, pp. 330–333.

Lacaita, A., et al., *Single–Photon Detection Beyond 1 μm: Performance of Commercially Available InGaAs/InP Detectors*, Applied Optics, vol. 35, No. 16, Jun. 1, 1996, pp. 2986–2996.

Lacaita, Andreal L., et al., *On the Bremsstrahlung Origin of Hot–Carrier–Induced Photons in Silicon Devices*, EIII Transactions on Electron Devices, vol. 40, No. 3., Mar. 1993, pp. 577–582.

Louis, T. A., et al., *Photoluminescence Lifetime Mocroscope Spectrometer Baed on Time–Correlated Single–Photon Counting with an Avalanche Diode Detector*, Rev. Sci. Instrum. 61(1), Jan. 1990, pp. 11–22.

Mellon,, Michael, *Imaging PMTs Detect in All Dimensions*, Laser Focus World, Mar. 1997, S21–S26.

Tsang, J.C., et al., *Picosecond Hot Electron Light Emission from Submicron Complementary Metal—Oxide—Semiconductor Circuits*, Appl. Phys. Lett. 70(7), Feb. 17, 1997, 1997 American Institute of Physics, pp. 889–891.

Shade, Gary F., *Physical Mechanisms for Light Emission Microscopy*, 1997 ASM International, pp. 121–128.

*Single Photon Counting Module, Technical Literature on SPCM–AQ Series, EG &G Canada*, pp. 1–7.

Uraoka, Yukiharu, et al., *Hot Carrier Evaluation of MOSFET's in ULSI Circuits Using the Photon Emission Method*, IEEE Transactions on Electron Devices, vol. 40, No. 8, Aug. 1993, pp. 1426–1430.

\* cited by examiner

US 6,608,494 B1

SINGLE POINT HIGH RESOLUTION TIME RESOLVED PHOTOEMISSION MICROSCOPY SYSTEM AND METHOD

This patent application is a continuation-in-part of the patent application entitled, "QUADRANT AVALANCHE PHOTODIODE TIME-RESOLVED DETECTION" by Bruce et al file on Sep. 30, 1999 and having application Ser. No. 09/409,088 now U.S. Pat. No. 6,483,327.

FIELD OF THE INVENTION

The invention relates to inspection of integrated circuits, and more particularly to inspection of integrated circuits using photo-emissions.

BACKGROUND OF THE INVENTION

The semiconductor industry has seen tremendous advances in technology in recent years, permitting dramatic increases in circuit density and complexity, and equally dramatic decreases in power consumption and package sizes. Present semiconductor technology now permits single-chip microprocessors with many millions of transistors, operating at speeds of tens (or even hundreds) of MIPS (millions of instructions per second) to be packaged in relatively small, air-cooled semiconductor device packages. A by-product of such high-density and high functionality in semiconductor devices has been the demand for increased numbers of external electrical connections to be present on the exterior of the die and on the exterior of the semiconductor packages which receive the die, for connecting the packaged device to external systems, such as a printed circuit board.

Typically, dies contain a bonding pad which makes the electrical connection to the semiconductor package. To shorten the electrical path to the pad, another packaging technology called flip-chip packaging is employed, where the pads were moved to the side of the die nearest the transistors and other circuit devices formed in the die. Connection to the package is made when the chip is flipped over and soldered. As a result, the dies are commonly called flip chips in the industry. Each bump on a pad connects to a corresponding package inner lead. The packages which result are lower profile and have lower electrical resistance and a shortened electrical path. The plurality of ball-shaped conductive bump contacts (usually solder, or other similar conductive material) are typically disposed in a rectangular array. The packages are occasionally referred to as "Ball Grid Array" (BGA) or "Area Grid Array" packages.

FIG. 1 is a cross-sectional view of an example BGA device 10. The device 10 includes an integrated circuit 12 mounted upon a larger package substrate 14. Substrate 14 includes two sets of bonding pads: a first set of bonding pads 16 on an upper surface adjacent to integrated circuit 12 and a second set of bonding pads 18 arranged in a two-dimensional array across an underside surface. Integrated circuit 12 includes a semiconductor substrate 20 having multiple electronic components formed within a circuit layer 22 upon a front side surface of semiconductor substrate 20 during wafer fabrication. The back side surface 23 remains exposed after the device 10 is formed. The electronic components are connected by electrically conductive interconnect lines to form an electronic circuit. Multiple I/O pads 24 are also formed within circuit layer 22. I/O pads 24 are typically coated with solder to form solder bumps 26.

The integrated circuit is attached to the package substrate using the controlled collapse chip connection method, which is also known as the C4® or flip-chip method. During the C4 mounting operation, solder bumps 26 are placed in physical contact with corresponding members of the first set of bonding pads 16. Solder bumps 26 are then heated long enough for the solder to reflow. When the solder cools, I/O pads 24 of integrated circuit 12 are electrically and mechanically coupled to the corresponding members of the first set of bonding pads 16 of the package substrate. After integrated circuit 12 is attached to package substrate 14, the region between integrated circuit 12 and package substrate 14 is filled with an under-fill material 28 to encapsulate the C4 connections and provide additional mechanical benefits.

Package substrate 14 includes one or more layers of signal lines that connect respective members of the first set of bonding pads 16 and the second set of bonding pads 18. Members of the second set of bonding pads 18 function as device package terminals and are coated with solder, forming solder balls 30 on the underside surface of package substrate 14. Solder balls 30 allow BGA device 10 to be surface mounted to an ordinary PCB. During PCB assembly, BGA device 10 is attached to the PCB by reflow of solder balls 30 just as the integrated circuit is attached to the package substrate.

The C4 mounting of integrated circuit 12 to package substrate 14 prevents physical access to circuit layer 22 for failure analysis and fault isolation. Thus, new approaches that are efficient and cost-effective are required.

It is well known that CMOS transistors emit photons during a state change, for example, switching the gate of a transistor. Photons are emitted from transistors at pn junctions, for example. These transient events occur on time scales that are less than 100 ps. Thus, in order to record these events, a very fast detector is required. In addition, a very sensitive detector is required for observing very weak emissions through the backside of the semiconductor because of the absorption losses in the silicon substrate. Another aspect of the emission analysis is to spatially resolve the emissions. It is desired to detect emissions from a single transistor where the device dimensions may be sized less than a micron. Therefore, an apparatus and method that provides fast and cost effective spatially and temporally resolved photoemission analysis of semiconductor circuits is desirable.

SUMMARY OF THE INVENTION

In various embodiments, methods and systems are provided for single point high resolution time resolved photoemission microscopy for an integrated circuit. In one embodiment, an apparatus is provided for analyzing an integrated circuit to which test signals are applied. The apparatus comprises a microscope, an aperture element, and a photo-diode. The microscope has an objective lens that forms a focal plane and is arranged to view the integrated circuit; the aperture element has an aperture which is optically aligned in the focal plane of the microscope; and the aperture element is positioned for viewing a selected area of the integrated circuit. The photo-diode is optically aligned with the aperture to detect photoemissions when test signals are applied to the integrated circuit.

In another embodiment, a process is provided for analyzing an integrated circuit with a microscope having a focal plane behind an objective lens. The process comprises placing an aperture element having an aperture in the focal plane of the objective lens of the microscope and positioning the aperture for viewing a selected area of the integrated circuit. A photo-diode is optically aligned with the aperture, and the integrated circuit is placed in view of the microscope. Test signals are applied to the integrated circuit, and a photo-emission is detected from the selected area of the integrated circuit.

The above summary is not intended to describe each illustrated embodiment or every implementation of the present invention. The figures and the detailed description which follow more particularly exemplify these embodiments.

BRIEF DESCRIPTION OF THE DRAWINGS

The following detailed description of the preferred embodiments can best be understood when read in conjunction with the following drawings, in which.

Figure 1:
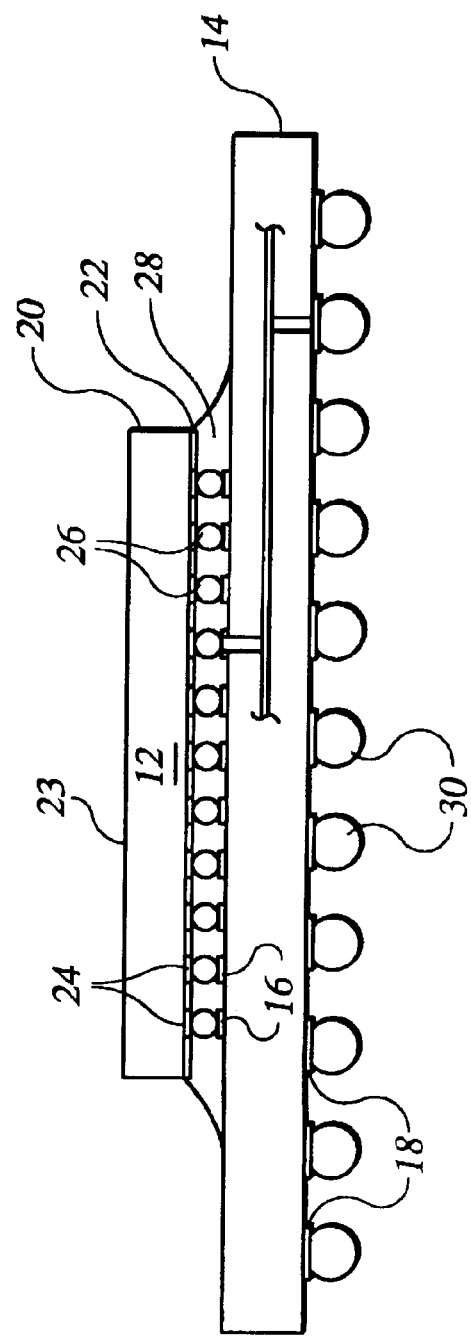
FIG. 1 is a cross-sectional view of an example BGA device. The device includes an integrated circuit mounted upon a larger package substrate.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to analysis of a variety of semiconductor structures and has been found to be particularly advantageous in analyzing flip-chip structures. While the present invention is not so limited, an appreciation of various aspects of the invention is best gained through a discussion of the example embodiments set forth below in which a flip-chip is analyzed.

Figure 2:
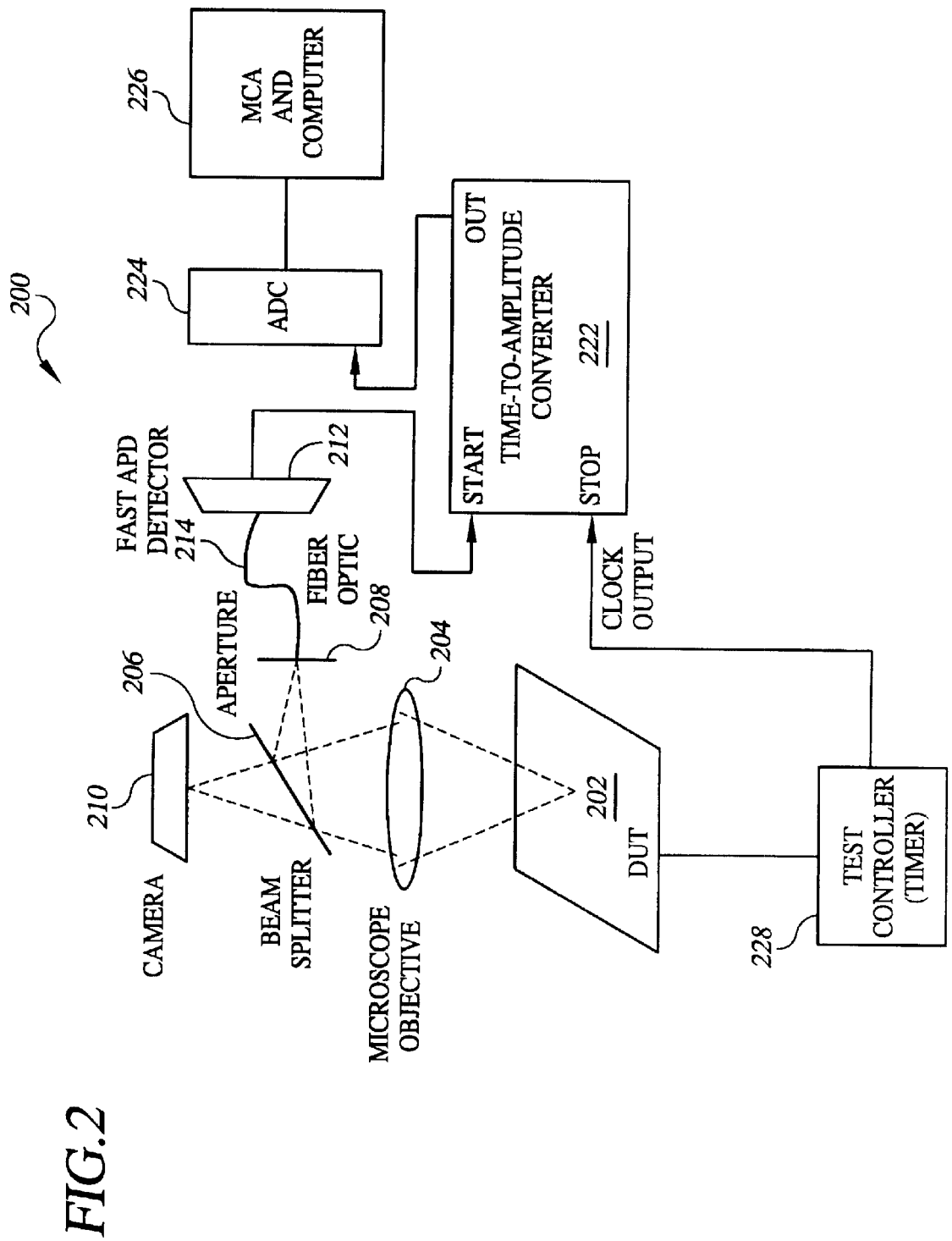
FIG. 2 is a block diagram of an example system for single spot time resolved photoemission detection.

FIG. 2 is a block diagram of an example system 200 for single spot time resolved photoemission detection. The integrated circuit undergoing analysis is shown as device under test (DUT) 202. The DUT 202 is positioned in view of microscope objective 204, which in an example embodiment, is part of a laser scanning microscope (not shown) for positioning the DUT 202 to view a selected area of the device. The microscope objective 204 is a near infrared objective to allow viewing through the back side of the DUT 202, for example. While a laser scanning microscope is used in the example embodiment, it will be appreciated that other types of microscopes, such as compound or metallurgical microscopes can be used to gather photoemissions from the device. For example, the Zeiss Axiotron and Olympus VANOX-T may be suitable.

While the embodiments described herein are suitable for back side analysis of integrated circuits, it should be understood that such embodiments are suitable or could be adapted for analysis of the front sides of the integrated circuits. While electron beam systems are commonly used for front side analysis, the embodiments of the present invention may be far more economical.

The beam splitter 206 is a cube-type beam splitter, for example. Other types that are capable of transmitting near infrared (IR) light would also be suitable, such as a Plate beam splitter or a Pellicle Beamsplitter. The beam splitter 206 is positioned behind the objective 204 to direct photoemissions from the DUT 202 to an aperture element 208 as well as to a photoemission camera 210.

The aperture element 208 is a pin hole aperture, for example, the FO Adapter/Aperture, part number 452735 that is available Carl Zeiss. The example aperture element has an opening of 0.3 microns to match the resolution of the microscope objective 204. Thus, no light is sacrificed with the aperture element and no undesirable additional light is gathered. A fiber optic cable with a small core diameter (e.g., >0.3 microns) could also be used as an aperture.

The aperture element 208 is optically aligned with the beam splitter 206 so that photoemissions from the DUT 202 are directed toward the opening of the aperture element. The size of the opening of the aperture can be selected in accordance with the size of an area of the DUT 202 for which analysis is desired, along with the resolution of the objective 204.

In another embodiment (not shown), a solid immersion lens (matching the index of refraction of the silicon substrate) could be positioned directly in contact with the surface of the DUT. Such a lens has a finer resolution because minimal air space separates the lens from the device. Thus, the aperture element could have a much smaller opening to allow detection of photoemissions from very small circuit elements.

In another embodiment, the aperture 208 could be positioned directly in the back focal plane of the objective 204. However, it will be appreciated that a camera system 210 would still be required for navigation. The beam splitter 206 could be removable or a removable mirror could be used to let light pass unfettered to the detector 212, wherein the beam splitter or mirror is moved into place during navigation. Alternatively, a movable, high reflectivity mirror could be positioned into the light path to direct the light towards the aperture and none to the camera during emission analysis. The mirror can be removed from the light path for navigation with the camera.

The aperture element 208 is optically coupled to an avalanche photodiode (APD) detector 212 with a fiber optic cable 214. The fiber optic cable 214 is a 0.002" glass fiber or, alternatively, a 0.012" diameter bundle of glass fibers, 0.55 NA. Commercially available products are suitable, such as the Fiber Optic Light Pipe with an FC connector and an opaque PVC sheathing from Micro Metrology Systems. The cable need not provide transmission of coherent light. However such a cable could be used. The fiber optic cable must be shielded with material that does not permit penetration of external light to the light transmitting fiber.

The APD detector 212 of the example embodiment provides high efficiency single-photon detection, for example the single photon counting module SPCM-AQ-151-FC from EG&G CANADA having a specified timing resolution of 300 ps. It will be appreciated that faster detectors can be used to analyze today's circuits in which devices, such as inverters, change state faster than 100 ps. In addition, as technology progresses and state changes occur at faster rates, even faster detectors can be used. Examples of other detectors that can be used include the Hamamatsu R3809U and the MCP-PMT. Prototype detectors have been demonstrated having a timing resolution in the range of 20 ps.

The placement of the aperture in the back focal plane of the objective and coupling the APD detector thereto with fiber optic cable effectively positions the detector in the focal plane of the objective. This provides enhanced spatial resolution that is limited only by the NA of the objective.

A time-to-amplitude converter 222 is coupled to the DUT 202 and to the APD detector 212. The converter 222 generates an output pulse whose amplitude is directly proportional to the time between the start and stop pulses from the detector 212 and the DUT 202, respectively. The APD detector 212 generates a start pulse each time a photon is detected, and the DUT 202 or tester provides a clock signal which the time-to-amplitude converter 222 uses as a stop pulse.

The output pulse from the converter 222 is digitized by a conventional analog-to-digital converter 224, and the digitized pulse is provided as input data to a computer 226 via a multi-channel analyzer (MCA) card. The input data represents the pulse height of the pulse output from the converter 222. The computer/MCA analyzes the digitized pulse height and increases the count of a histogram data point, where the data point is selected based on the pulse height. For example, the pulse height represents a time interval in which the photoemission was detected. Thus, the count for that time interval is incremented upon detection of a photoemission.

The time-to-amplitude converter is, for example, a model TC862 from Oxford. Other suitable converters include the Canberra model 2145.

In an alternative embodiment, a time-to-digital converter could be used in place of the time-to-amplitude converter 222 and ADC 224. An example time-to-digital converter is the model 1875 TDC that is available from Lecroy.

A test controller 228 is coupled to the DUT 202 for providing test signals as input. The test controller includes conventional hardware and software for configuring and loading test vectors in the DUT 202. The camera 210 is optionally included to provide navigation and a global view of the DUT 202. A resistive anode microchannel plate photo-multiplier tube camera has been demonstrated to have captured picosecond photoemissions.

Figure 3:
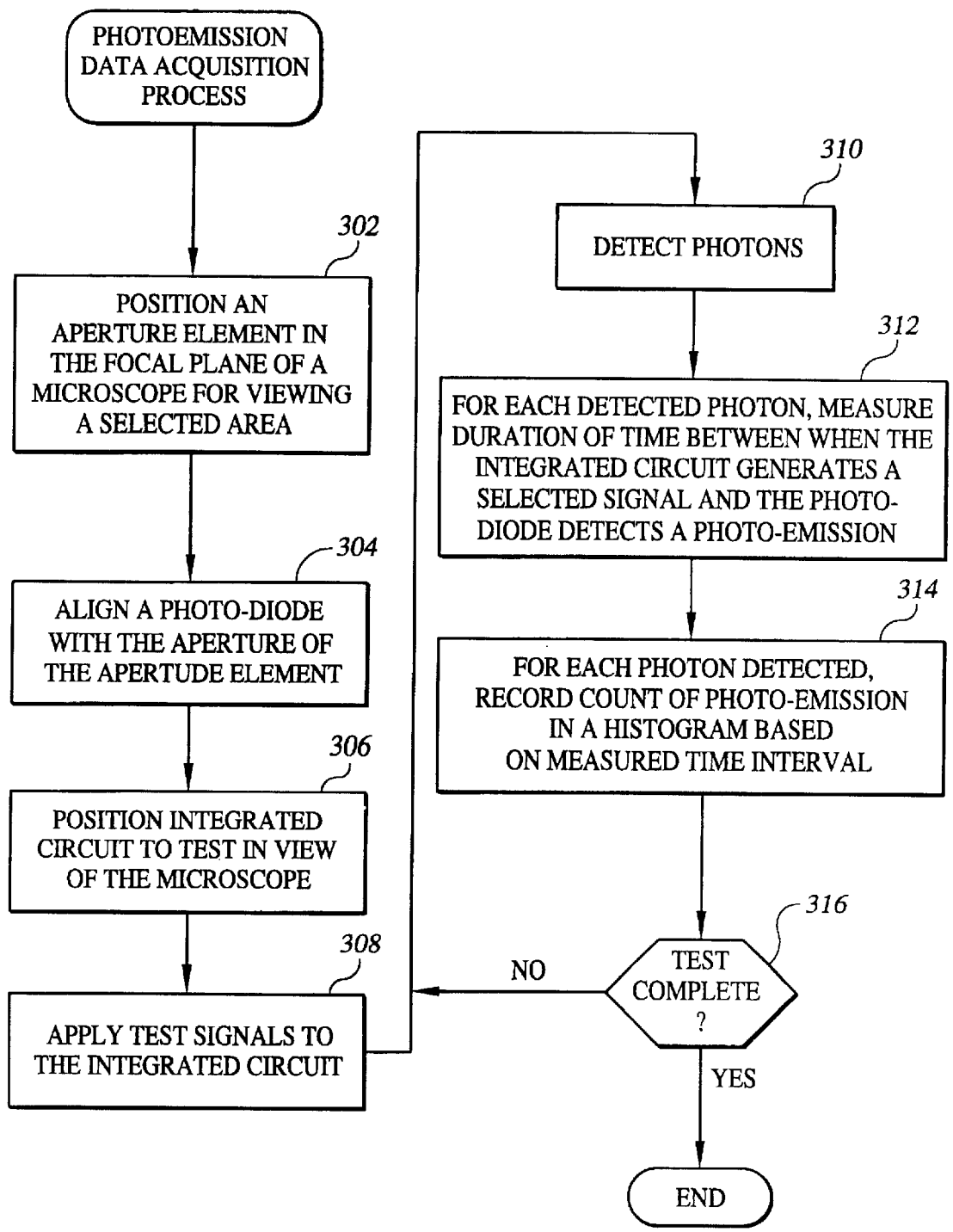
FIG. 3 is a flowchart of a process for single point high resolution time resolved analysis of photoemissions, according to an example embodiment of the invention.

FIG. 3 is a flowchart of a process for single point high resolution time resolved analysis of photoemissions, according to an example embodiment of the invention. At step 302, an aperture element 208 is positioned in the back focal plane of a microscope for viewing a selected area of a DUT 202. In the example embodiment of FIG. 2, this is effectively accomplished with the beam splitter 206. However, it will be appreciated that the aperture element 212 could also be physically placed in the back focal plane of the objective 204 without requiring a beam splitter.

At step 304, a photodiode detector 212 is aligned with the aperture 208. It will be appreciated that in the example embodiment of FIG. 2, this is effectively accomplished with the APD 212 along with the fiber optic cable 214. In another embodiment, the detector 212 could be physically aligned with the aperture 203.

The DUT 202 is positioned in view of the objective 204 at step 306 and brought into focus. Selected test signals are applied to the DUT by a test controller 229 at step 308.

Photoemissions from the area of the DUT 202 which is visible through the aperture element 208 are detected by the photo-diode at step 310. At steps 312 and 314, a histogram of photoemissions is created based on the temporal relationships between output pulses of the photo-diode and a clock signal that is output by the DUT 202. Conventional time-correlated single-photon-counting (TCSPC) techniques are used in the example embodiment. When the desired data has been acquired, the process is complete. Otherwise, step 316 returns the process to step 310 to gather more photoemission data.

Figure 4:
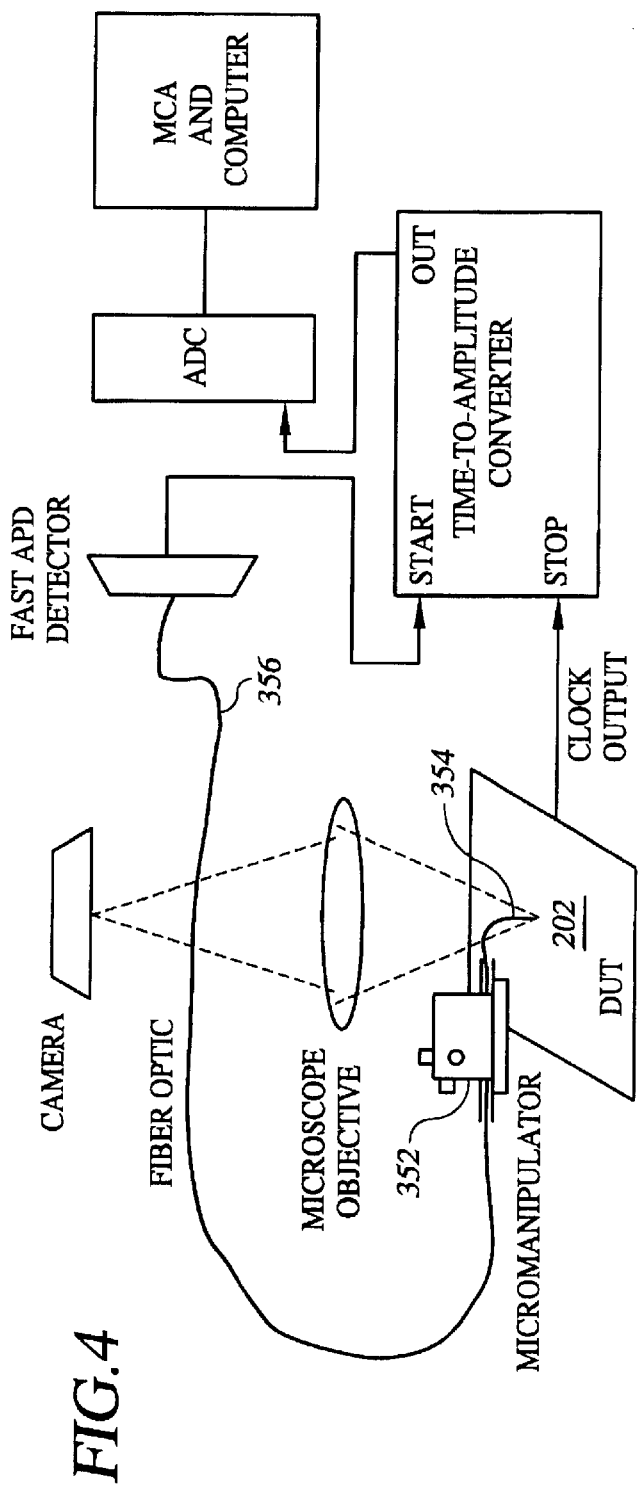
FIG. 4 is a block diagram of a system for single spot time resolved photoemission detection, according to another example embodiment of the invention.

FIG. 4 is a block diagram of a system for single spot time resolved photoemission detection, according to another example embodiment of the invention. The embodiment of FIG. 4 differs from that of FIG. 2 in that the beam splitter 206 and aperture element 208 are replaced with a micromanipulator 352. The micromanipulator 352 is movable about the area of the DUT 202 and includes a fiber optic probe 354 for capturing photoemissions from a selected area of the DUT.

The fiber optic probe 354 includes a metal tube (not shown) and an optical fiber threaded through the tube. The metal tube has a 90° bend to direct one end of the fiber toward the DUT 202, the other end of the tube being attached to the micromanipulator 352. The optic fiber of the probe 354 is coupled to the fiber optic cable 356 via the micromanipulator 352. Fiber optic cable that is comparable to cable 214 of FIG. 2 is suitable. An example micromanipulator is the model PH120 that is available from the Karl Suss company. Those skilled in the art will recognize comparable models that are available from other vendors which are suitable for the present invention.

Figure 5:
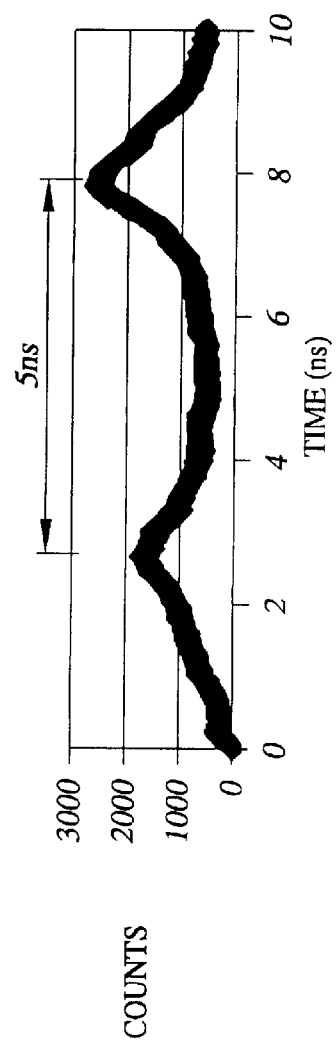
FIG. 5 is a graph of an example histogram of data compiled while detecting photoemissions from a selected area of an integrated circuit using the embodiment of FIG. 4 and conventional time-correlated single-photon-counting techniques.

FIG. 5 is a graph of an example histogram compiled while detecting photoemissions from a selected area of an integrated circuit using the embodiment of FIG. 4 and conventional TCSPC techniques. The example histogram of FIG. 5 was compiled from a DUT that outputs a clock pulse every 2 ns, wherein each data point in the graph represents a count of photoemission events detected in a 12.5 ps interval.

The 5 ns interval between the peaks in the histogram illustrates the time interval between transitions of two inverters at an end of a ring oscillator. Given that the cycle time for an inverter is 10 ns in the example system, and photons are emitted only once during a cycle (e.g., going from a high logic level to a low logic level, but not in the transition from a low logic level to a high logic level), photons will be emitted every 5 ns by the two adjacent inverters.

Once photoemission data is collected, such as the example data of FIG. 5, timing specifications for the DUT can be analyzed and compared to the photoemission data to determine whether the circuit is functioning as expected.

Usage of conventional equipment in the example embodiments set forth above results in a system that is cost effective, yet highly functional. For example, instead of using a state-of-the-art camera for viewing the whole DUT 202, an APD detector 212 is used to detect single photons in a selected area of the DUT.

As noted above, the present invention is applicable to analysis of a number of different semiconductor structures and arrangements. Furthermore, the invention may be implemented in various forms using equipment that is comparable to that identified herein. Accordingly, the present invention should not be considered limited to the particular examples described above, but rather should be understood to cover all aspects of the invention as fairly set out in the attached claims. Various modifications, equivalent structures, as well as numerous structures to which the present invention may be applicable will be readily apparent to those of skill in the art upon review of the present specification. The claims are intended to cover such modifications and devices.

What is claimed is:

1. An apparatus for analyzing an integrated circuit to which test signals are applied, comprising:
   a microscope having an objective lens forming a back focal plane and arranged to view the integrated circuit;
   an aperture element having an aperture optically aligned in the back focal plane of the microscope and positioned for viewing a selected area of the integrated circuit; and
   a photo-diode optically aligned with the aperture and adapted to detect a photoemission from the die.

2. The apparatus of claim 1, wherein the photo-diode is an avalanche photo-diode.

3. The apparatus of claim 1, further comprising a timer circuit communicatively coupled to the photo-diode, and arranged to communicatively couple to the integrated circuit to provide an output signal indicative of time expired between occurrence of a signal from the integrated circuit and a signal from the photo-diode.

4. The apparatus of claim 3, further comprising a computer coupled to the timer circuit, and configured and arranged to record the output signal.

5. The apparatus of claim 3, wherein the timer circuit is a time-to-amplitude converter.

6. The apparatus of claim 1, further comprising a beam splitter disposed behind the objective lens and arranged to direct light from the integrated circuit to the aperture.

7. The apparatus of claim 6, wherein the beam splitter is a cube-type beam splitter.

8. The apparatus of claim 6, further comprising fiber optic cable optically aligned coaxial with the aperture and the photo-diode.

9. The apparatus of claim 1, further comprising an analog-to-digital converter coupled between the timer and the computer.

10. The apparatus of claim 9, further comprising a multi-channel analyzer board coupled to the analog-to-digital converter.

11. The apparatus of claim 1, wherein the microscope includes a near infrared microscope objective.

12. The apparatus of claim 11, wherein the aperture element is a pin hole aperture having an opening that matches the resolution of the microscope objective.

13. A process for analyzing an integrated circuit with a microscope having a focal plane behind an objective lens, comprising the steps of:
   placing an aperture element having an aperture in the focal plane of the objective lens of the microscope and positioning the aperture for viewing a selected area of the integrated circuit;
   optically aligning a photo-diode with the aperture;
   placing an integrated circuit in view of the microscope;
   applying signals to the integrated circuit; and
   detecting a photo-emission from the selected area of integrated circuit.

14. The process of claim 13, further comprising, repeating the steps of claim 13 for a selected period of time and recording the durations of time in a histogram.

15. The process of claim 13, wherein the integrated circuit has a front side and a back side, and the back side is exposed for viewing with the microscope.

16. The process of claim 13, further comprising the step of measuring a duration of time between occurrence of a selected output signal from the integrated circuit and an output signal from the photo-diode.

17. The process of claim 16, further comprising the step of generating a voltage at a level proportional to the duration of time between when a selected signal is output from the integrated circuit and the photo-diode outputs a signal.

18. The process of claim 17, further comprising the step of communicatively coupling the photo-diode and the integrated circuit to a time-to-amplitude converter.

19. The process of claim 18, further comprising the step of coupling the time-to-amplitude converter to an analog-to-digital converter and coupling the analog-to-digital converter to a computer.

20. An arrangement for analyzing an integrated circuit, the arrangement comprising:
   a photoemission detector adapted to detect a photoemission from the integrated circuit;
   an aperture adapted to direct a photoemission from the integrated circuit to the phtotemission detector; and
   an analysis device adapted to use the detected photoemission and to analyze the integrated circuit therefrom.

21. The arrangement of claim 20, further comprising a solid immersion lens adapted to be positioned directly on a device in which the integrated circuit is formed and to direct the photoemission from a selected portion of the integrated circuit to the photoemission detector.

22. The arrangement of claim 20, further comprising a micromanipulator having a fiber optic probe and coupled to the photoemission detector, wherein the micromanipulator is adapted move the probe to capture photoerissions from a selected portion of the integrated circuit and direct the photoemissions to the photoemission detector.

23. The arrangement of claim 20, further comprising a test controller communicatively coupled to the integrated circuit and adapted to input signals to the integrated circuit.

24. The arrangement of claim 20, wherein the analysis device includes a timing arrangement adapted to output a signal representing a time interval at which the photoemission is detected.

25. The arrangement of claim 24, further comprising a test controller communicatively coupled to the integrated circuit and adapted to input signals to the integrated circuit and to provide a clock output to the timing arrangement, the clock output being indicative of the generation of an input signal to the integrated circuit.

26. The arrangement of claim 25, further comprising a computer adapted to receive an output from the timing arrangement, the output representing a time interval at which the photoemission is detected.

27. The arrangement of claim 26, wherein the test controller is adapted to apply test signals to the integrated circuit in a loop, and wherein the computer is adapted to record the number of photoemissions detected at time intervals during each loop.

28. An arrangement for analyzing an integrated circuit, the arrangement comprising:
   a photoemission detector adapted to detect a photoemission from the integrated circuit;
   an analysis device adapted to use the detected photoemission and to analyze the integrated circuit therefrom; and
   a microscope having an objective, a beam splitter and an aperture, wherein the aperture is adapted to direct a photoemission from the integrated circuit to the photoemission detector.

29. The arrangement of claim 28, wherein the aperture includes at least one of: a fiber optic cable and a pin hole aperture.

30. An method for analyzing an intregrated circuit, the method comprising:

applying test signals in a loop to the intregrated circuit;

starting a timer concurrently with the start of each loop;

detecting photoemissions from the integrated circuit;

using the timer to record the duration of time between application of the test signals and the detection of the photoemissions; and using the recorded time and detected photoemissions and developing a record of the number of photoemissions detected at selected time intervals during each loop.

31. A process for analyzing an integrated circuit with a microscope having a focal plane behind an objective lens, comprising the steps of:

placing an aperture element having an aperture in the focal plane of the objective lens of the microscope and positioning the aperture for viewing a selected area of the integrated circuit;

optically aligning a photo-diode with the aperture;

placing an integrated circuit in view of the microscope;

applying signals to the integrated circuit; and detecting a photo-emission from the selected area of the integrated circuit; and using the detected photoemission to modify the design of the integrated circuit device.

32. The process of claim 31, further comprising manufacturing an integrated circuit device as modified.

* * * * *

UNITED STATES PATENT AND TRADEMARK OFFICE
CERTIFICATE OF CORRECTION

PATENT NO.    : 6,608,494 B1                                       Page 1 of 1
DATED         : August 19, 2003
INVENTOR(S)   : Bruce et al.

It is certified that error appears in the above-identified patent and that said Letters Patent is hereby corrected as shown below:

<u>Column 1,</u>
Line 38, "the pads" should read -- the bonding pads --.

<u>Column 5,</u>
Line 10, "A time-to-amplitude converter 222" should read -- A time circuit, including a time-to-amplitude-converter 222 --.

Signed and Sealed this

Thirteenth Day of January, 2004

JON W. DUDAS
*Acting Director of the United States Patent and Trademark Office*